United States Patent
Waragaya et al.

(10) Patent No.: US 8,581,287 B2
(45) Date of Patent: *Nov. 12, 2013

(54) SEMICONDUCTOR LIGHT EMITTING DEVICE HAVING A REFLECTIVE MATERIAL, WAVELENGTH CONVERTING LAYER AND OPTICAL PLATE WITH ROUGH AND PLANE SURFACE REGIONS, AND METHOD OF MANUFACTURING

(75) Inventors: Takeshi Waragaya, Tokyo (JP); Kosaburo Ito, Tokyo (JP); Toshihiro Seko, Tokyo (JP); Kazuhiko Ueno, Tokyo (JP); Soji Owada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/355,754

(22) Filed: Jan. 23, 2012

(65) Prior Publication Data

US 2012/0236582 A1    Sep. 20, 2012

Related U.S. Application Data

(63) Continuation-in-part of application No. 13/162,151, filed on Jun. 16, 2011, now Pat. No. 8,461,610.

(30) Foreign Application Priority Data

Jan. 24, 2011   (JP) .................................. 2011-011820

(51) Int. Cl.
    *H01L 33/00*    (2010.01)
(52) U.S. Cl.
    USPC ........ 257/98; 257/79; 257/101; 257/E33.072; 438/22; 438/28; 438/29; 438/45; 369/243; 369/249.01; 313/501

(58) Field of Classification Search
    None
    See application file for complete search history.

(56) References Cited

U.S. PATENT DOCUMENTS

| | | | |
|---|---|---|---|
| 7,078,732 | B1 | 7/2006 | Reeh et al. |
| 7,679,100 | B2 | 3/2010 | Schwenkschuster et al. |

(Continued)

FOREIGN PATENT DOCUMENTS

| | | |
|---|---|---|
| EP | 1 189 291 A2 | 3/2002 |
| JP | 11-340515 A | 12/1999 |
| JP | 2004-31989 A | 1/2004 |
| JP | 2004-40099 A | 2/2004 |

(Continued)

OTHER PUBLICATIONS

List of Potentially Related Pending U.S. Patent Applications citing U.S. Appl. No. 13/162,151 to Kosaburo Ito et al. filed Jun. 16, 2011; U.S. Appl. No. 13/196,868 to Kosaburo Ito et al. filed Aug. 2, 2011; U.S. Appl. No. 13/229,663 to Toshihiro Seko et al. filed Sep. 9, 2011; and U.S. Appl. No. 13/325,038 to Takeshi Waragawa et al. filed Dec. 13, 2011.

*Primary Examiner* — Howard Weiss
*Assistant Examiner* — Cesar Lopez
(74) *Attorney, Agent, or Firm* — Kenealy Vaidya LLP

(57) ABSTRACT

A semiconductor light-emitting device and a method for manufacturing the same can include a wavelength converting layer in order to emit various colored lights including white light. The device can include a board, a frame located on the board, at least one light-emitting chip mounted on the board, the wavelength converting layer located between an optical plate and an outside surface of the chips so that a density of a peripheral region is lower than that of a middle region, and a reflective material layer disposed at least between the frame and a side surface of the wavelength-converting layer. The device can have the reflective material layer form each reflector and can use a wavelength converting layer having different densities, and therefore can emit a wavelength-converted light having a high light-emitting efficiency and a uniform color tone from various small light-emitting surfaces.

20 Claims, 7 Drawing Sheets

(56) References Cited

U.S. PATENT DOCUMENTS

| | | |
|---|---|---|
| 2006/0022211 A1 | 2/2006 | Yatsuda et al. |
| 2007/0086148 A1 | 4/2007 | Schwenkschuster et al. |
| 2008/0054279 A1 | 3/2008 | Hussell et al. |
| 2009/0001490 A1 | 1/2009 | Bogner et al. |
| 2009/0134417 A1* | 5/2009 | Sato et al. .................. 257/98 |
| 2009/0159912 A1 | 6/2009 | Engl et al. |
| 2011/0180822 A1 | 7/2011 | Ruhnau et al. |
| 2012/0235169 A1* | 9/2012 | Seko et al. .................. 257/88 |

FOREIGN PATENT DOCUMENTS

| | | |
|---|---|---|
| JP | 2006-48934 A | 2/2006 |
| JP | 2007-103937 A | 4/2007 |
| JP | 2008-507850 A | 3/2008 |
| JP | 2008-103688 A | 5/2008 |
| JP | 2009-135136 A | 6/2009 |
| JP | 2009-526377 A | 7/2009 |
| JP | 2009-218274 A | 9/2009 |
| JP | 2010-118531 A | 5/2010 |

* cited by examiner

US 8,581,287 B2

SEMICONDUCTOR LIGHT EMITTING DEVICE HAVING A REFLECTIVE MATERIAL, WAVELENGTH CONVERTING LAYER AND OPTICAL PLATE WITH ROUGH AND PLANE SURFACE REGIONS, AND METHOD OF MANUFACTURING

This application is a continuation-in-part application claiming priority under 35 U.S.C. §120 to co-pending U.S. patent application Ser. No. 13/162,151 filed on Jun. 16, 2011 entitled Semiconductor Light-Emitting Device and Manufacturing Method, which claims priority under 35 U.S.C. §119 to Japanese Patent Application No. 2010-137365 filed on Jun. 16, 2010. This application separately claims priority under 35 U.S.C. §119 to Japanese Patent Application No. 2011-011820 filed on Jan. 24, 2011. All of the above-referenced priority documents are hereby incorporated in their entirety by reference.

BACKGROUND

1. Field

The presently disclosed subject matter relates to semiconductor light-emitting devices in which light emitted from at least one semiconductor light-emitting chip is wavelength-converted by a wavelength converting layer, and to manufacturing methods for the same. More particularly, the disclosed subject matter relates to semiconductor light-emitting devices for a vehicle light and the like, which can emit light having a high light-emitting efficiency and a uniform color tone from various small light-emitting surfaces, and to methods of manufacturing such devices.

2. Description of the Related Art

Semiconductor light-emitting devices, in which a part of light emitted from a semiconductor light-emitting chip is converted into light having a different wavelength by a phosphor and in which a mixture light including the light having the different wavelength mixed with the light emitted directly from the light-emitting chip is emitted, have been used as a light source for various lighting units. Conventional semiconductor light-emitting devices including a wavelength converting material, for example, are disclosed in Patent Document No. 1 (Japanese Patent Application Laid Open JP2004-31989).

FIGS. 6a and 6b are side cross-sectional views showing a conventional lead frame type light-emitting device and a conventional radial type light-emitting device, respectively, which are disclosed in Patent Document No. 1. The conventional lead frame type light-emitting device 20 includes: a casing 26 having a cavity 27; a pair of lead frames 22, 23 located on a bottom surface of the cavity 27 of the casing 26; a semiconductor light-emitting chip 21 having a bottom electrode and a top electrode mounted on the lead frame 22, the bottom electrode electrically connected to the lead frame 22, and the top electrode electrically connected to the lead frame 23 via a bonding wire 24; and a phosphor resin 25 located on an opening of the cavity 27 of the casing 26 so as to be able to wavelength-convert light emitted from the semiconductor light-emitting chip 21.

The conventional radial type light-emitting device 30 includes: a casing 36 composed of a transparent resin; a pair of lead frames 32, 33 located in the casing 36; a semiconductor light-emitting chip 31 having a first electrode and a second electrode mounted in a cup of the lead frame 32, the first electrode electrically connected to the lead frame 32 via a bonding wire 34a, and the second electrode electrically connected to the lead frame 33 via a bonding wire 34b; a phosphor resin 35 disposed in the cup of the lead frame 32 so as to encapsulate the semiconductor light-emitting chip 31.

The lead frame type light-emitting device 20 may emit a wavelength-converted light via the phosphor resin 25 so as to expand the light from the cavity 27 of the casing 26. Accordingly, it may be difficult for the lead frame type light-emitting device 20 to reduce the size of a light-emitting surface because the light expands from the cavity 27. Additionally, the radial type light-emitting device 30 may emit a wavelength-converted light in a radial fashion from the casing 36, and therefore may also be difficult to reduce the size of a light-emitting surface.

In addition, conventional lead frame type semiconductor light-emitting devices that may emit a wavelength-converted light having a high brightness are disclosed in Patent Document No. 2 (Japanese Patent Application Laid Open JP2004-40099) and Patent Document No. 3 (Japanese Patent Application Laid Open JP2008-507850). A light-emitting device disclosed in Patent Document No. 2 includes a concave reflective material in a cavity that has semiconductor light-emitting chips mounted therein so that light emitted from the semiconductor light-emitting chips is efficiently emitted from the cavity.

Another light-emitting device disclosed in Patent Document No. 3 includes a plurality of semiconductor light-emitting chips and a cavity, in which the plurality of light-emitting chips are mounted at a predetermined interval therein. Thereby, Patent Document No. 3 discloses that semiconductor light-emitting devices may emit a wavelength-converted light having a high brightness from the cavity such that the device may be used as a light source for a vehicle headlight.

Moreover, a conventional method for manufacturing semiconductor light-emitting device having a cavity and a phosphor is disclosed in Patent Document No. 4 (Japanese Patent Application Laid Open JP2008-103688), and a conventional radial type light-emitting device, in which a resin including a phosphor is directly disposed around a semiconductor substrate including a light-emitting layer in place of the cup of the lead frame disclosed in Patent Document No. 1, is disclosed in Patent Document No. 5 (Japanese Patent Application Laid Open JP2009-135136) as a light source for general lighting, vehicle lamps, etc.

However, when the semiconductor light-emitting devices are used as a light source for a lighting unit such as a vehicle headlight, which controls light emitted from the light-emitting devices using a reflector and/or a projector lens, a light-emitting device having a small light-emitting surface may be desired to efficiently control light emitted from the light-emitting device with a small optical structure. Therefore, the semiconductor light-emitting devices including the cavities disclosed in Patent Documents No. 1 to No. 4 may not be a match for the above-described usage, and also the radial type light-emitting devices disclosed in Patent Document No. 1 and No. 5 may not be a match for the usage.

A semiconductor light-emitting device having a small light-emitting surface can be used as a light source for a vehicle headlight using a projector lens and is disclosed in Patent Document No. 6 (Japanese Patent Application Laid Open JP2009-218274). FIG. 7 is a cross-sectional view showing the conventional semiconductor light-emitting device disclosed in Patent Document No. 6.

The conventional semiconductor light-emitting device 40 includes: a base board 42; semiconductor light-emitting chips 41 mounted on the base board 42; a wavelength converting layer 45 disposed on the semiconductor light-emitting chips 41; and a reflecting member 46 located around the semiconductor light-emitting chips 41 and the wavelength converting layer 45 so as to encapsulate the semiconductor light-emitting chips 41 along with the base board 42 and the wavelength converting layer 45.

The conventional semiconductor light-emitting device 40 can emit a wavelength-converted light from a small light-emitting surface via the wavelength converting layer 45, because the light-emitting surface of the conventional semiconductor light-emitting device 40 can become nearly equal to top surfaces of the semiconductor light-emitting chips 41. In addition, because light emitted from side surfaces of the semiconductor light-emitting chips 41 and the wavelength converting layer 45 may be reflected into the semiconductor light-emitting chips 41 and the wavelength converting layer 45 by the reflecting member 46 and may be emitted from a top surface of the wavelength converting layer 45, a light intensity in a frontward direction of the conventional light-emitting device 40 may improve.

However, when a side surface of the reflecting member 46 is located perpendicular to the base board 42 mounting the semiconductor light-emitting chips 41 in the semiconductor light-emitting device 40 as shown in FIG. 7, light reflected on the side surface of the reflecting member 46, which contacts with the side surfaces of the semiconductor light-emitting chips 41, may return into the semiconductor light-emitting chips 41. Accordingly, because an absorbing band of the semiconductor light-emitting chips 41 includes a wavelength of the reflected light, the reflected light and an absorbing light may increase in the semiconductor light-emitting chips 41. The increase of the reflected light and the absorbing light may cause a decrease in a total amount of light flux emitted from the conventional semiconductor light-emitting device 40.

Therefore, semiconductor light-emitting devices that can emit a wavelength-converted light having a high light-emitting efficiency from a small light-emitting surface have been developed in accordance with the presently disclosed subject matter.

The above-referenced Patent Documents are listed below, and are hereby incorporated with their English abstracts in their entireties.
1. Patent Document No. 1: Japanese Patent Application Laid Open JP2004-31989
2. Patent Document No. 2: Japanese Patent Application Laid Open JP2004-40099
3. Patent Document No. 3: Japanese Patent Application Laid Open JP2008-507850
4. Patent Document No. 4: Japanese Patent Application Laid Open JP2008-103688
5. Patent Document No. 5: Japanese Patent Application Laid Open JP2009-135136
6. Patent Document No. 6: Japanese Patent Application Laid Open JP2009-218274
7. Patent Document No. 7: Japanese Patent Application No. 2010-137365 (and related U.S. patent application Ser. No. 13/162,151 filed on Jun. 16, 2011, the disclosure of which is incorporated by reference herein)
8. Patent Document No. 8: Japanese Patent Application No. 2010-173852 (and related U.S. patent application Ser. No. 13/196,868 filed on Aug. 2, 2011, the disclosure of which is incorporated by reference herein)
9. Patent Document No. 9: Japanese Patent Application No. 2010-201985 (and related U.S. patent application Ser. No. 13/229,663 filed on Sep. 9, 2011, the disclosure of which is incorporated by reference herein)
10. Patent Document No. 10: Japanese Patent Application No. 2010-276875 (and related U.S. patent application Ser. No. 13/325,038 filed on Dec. 13, 2011, the disclosure of which is incorporated by reference herein)

The disclosed subject matter has been devised to consider the above and other problems, features, and characteristics. Thus, embodiments of the disclosed subject matter can include semiconductor light-emitting devices that can emit a wavelength-converted light having a high light-emitting efficiency and a uniform color tone from various small light-emitting surfaces, and associated manufacturing methods that do not cause and/or are designed to prevent some of the above-described problems, concerns, and characteristics related to a wavelength converting layer. The disclosed subject matter can also include a semiconductor light-emitting device using a plurality of semiconductor light-emitting chips, which can be used for wavelength-converting light having a high light-emitting efficiency and a substantially uniform color tone from various small light-emitting surfaces, and which can also improve color variability between light emitted from the light-emitting chips.

SUMMARY

The presently disclosed subject matter has been devised in view of the above and other problems, features, and characteristics. Aspects of the disclosed subject matter include a vehicle headlight using semiconductor light-emitting devices having a high light-emitting efficiency and a substantially uniform white tone, and also include methods of manufacture that provide the semiconductor light-emitting devices having various small light-emitting surfaces and a high light-emitting efficiency such that can be used as a light source for a vehicle headlight, and which can provide a similar lead time while using a similar manufacture machine in comparison with conventional semiconductor light-emitting devices and processes.

According to an aspect of the disclosed subject matter, a semiconductor light-emitting device can include: a base board having a mounting surface and a conductor pattern formed on the mounting surface; a semiconductor light-emitting chip having a bottom surface, a top surface and an outside surface, and including chip electrodes adjacent the bottom surface, each of the chip electrodes electrically connected to a respective portion of the conductor pattern of the base board via solder bumps; an optical plate having a side surface, a bottom surface, a middle region, a peripheral region and an edge located between the side surface and the bottom surface, the peripheral region surrounding the middle region and including the edge of the optical plate, the optical plate being located over the top surface of the semiconductor light-emitting chip so that the middle region of the optical plate overlaps the top surface of the semiconductor light-emitting chip; a wavelength converting layer having a side surface and a thickness, the wavelength converting layer including at least one phosphor and disposed between the edge of the optical plate and the outside surface of the semiconductor light-emitting chip so that the side surface of the wavelength converting layer extends from the outside surface of the semiconductor light-emitting chip toward the edge of the optical plate, wherein a density of the at least one phosphor included in the wavelength converting layer that is disposed between the middle region of the optical plate and the top surface of the semiconductor light-emitting chip is higher than that of the phosphor included the wavelength converting layer that is disposed between the peripheral region of the optical plate and the outside surface of the semiconductor light-emitting chip; a frame located adjacent the mounting surface of the base board so as to surround the semiconductor light-emitting chip and the wavelength converting layer; and a reflective material layer having an inclined side surface disposed between the frame and both the side surface of the wavelength converting layer and the side surface of the optical plate and between the bottom surface of the semiconductor light-emitting chip and the mounting surface of the base board while also surrounding the solder bumps, wherein the inclined side surface contacts with the side surface of the wavelength converting layer and extends from the outside surface of the semiconductor light-emitting chip toward the edge of the optical plate.

According to another aspect of the disclosed subject matter, a semiconductor light-emitting device can include: a base board having a conductor pattern formed on a mounting surface thereof; a plurality of semiconductor light-emitting chips having an outside surface and at least one pair of adjacent surfaces, and each of the light-emitting chips formed in a substantially cubic shape and including chip electrodes adjacent a bottom surface thereof, each of the chip electrodes electrically connected to a respective portion of the conductor pattern via solder bumps, and the light-emitting chips aligned so that each of the at least one pair of adjacent surfaces is substantially parallel with respect to each other; and an optical plate having an edge located between a side surface and a bottom surface, a peripheral region thereof surrounding a middle region and including the edge, the optical plate being located over the top surface of each of the light-emitting chips so that the middle region thereof overlaps the top surface of each of the light-emitting chips.

Additionally, the semiconductor light-emitting device can include: a wavelength converting layer including at least one phosphor and disposed between the outside surface of the semiconductor light-emitting chips and the edge of the optical plate so that the side surface of the wavelength converting layer extends from the outside surface of the light-emitting chips toward the edge of the optical plate, and at least one concave surface thereof located between the at least one pair of adjacent surfaces and formed in a concave shape toward the peripheral region of the optical plate, wherein a density of the phosphor included in the wavelength converting layer that is disposed between the middle region and the top surface of each of the semiconductor light-emitting chips is higher than that of the phosphor included the wavelength converting layer that is disposed between the peripheral region and both the outside surface of the semiconductor light-emitting chip and the concave surface of the wavelength converting layer; a frame located adjacent the mounting surface of the base board so as to surround the wavelength converting layer and the semiconductor light-emitting chips; and a reflective material layer disposed between the frame and the side surfaces of the wavelength converting layer and the optical plate and between the bottom surface of each of the light-emitting chips and the mounting surface of the base board, wherein a side slant surface thereof contacts with the side surface of the wavelength converting layer and extends from the outside surface of the light-emitting chips toward the edge of the optical plate, and at least one convex surface thereof also contacts with the at least one concave surface of the wavelength converting layer and extends toward the peripheral region of the optical plate between the at least one pair of adjacent surfaces of the of semiconductor light-emitting chips.

In the above-described exemplary semiconductor light-emitting device, the wavelength converting layer can include an upper layer and a lower layer that are divided by an imaginary central plane between the bottom surface of the optical plate and the top surface of each of the light-emitting chips, and a density of the phosphor included in the wavelength converting layer of the lower layer can be higher than that of the phosphor included in the wavelength converting layer of the upper layer in order to reduce color variability of light emitted from the top surface of each of chips. The bottom surface of the peripheral region of the optical plate can be formed in a rough surface, and a roughness on the bottom surface of the peripheral region can be larger than that of the middle region in order to ease a control of a ratio of the densities of the phosphor between the middle region and the peripheral region of the optical plate.

Moreover, in the above-described exemplary semiconductor light-emitting device, the side slant surface of the reflective material layer can be formed in at least one of a substantially linear shape and a convex shape having a curvature of 5 or less extending in a direction toward the semiconductor light-emitting chips to further improve light-emitting efficiency of the device. The device can further include an outer meniscus control structure projecting from the bottom surface of the optical plate toward the semiconductor light-emitting chips and extending along the edge of the optical plate so that the side surface of the wavelength converting layer extends from the outside surface of the light-emitting chips thereto in order to easily be able to form various light-emitting surfaces, and also can further include a particulate spacer disposed in the wavelength converting layer, wherein a thickness of the wavelength converting layer is defined between the top surface of each of the light-emitting chips and the bottom surface of the optical plate by supporting the bottom surface of the optical plate using the particulate spacer.

According to the above-described exemplary semiconductor light-emitting device, the device can emit a wavelength-converted light from a top surface of the optical plate that is slightly larger than the top surface of each of the light-emitting chips while the side slant surface of the reflective material layer can be used as a reflector for each of the light-emitting chips along with the at least one convex surface. In this case, even when the device includes the plurality of light-emitting chips, a density of the phosphor included in the wavelength converting layer that is disposed between the middle region and the top surface of each of the semiconductor light-emitting chips can be higher than that of the phosphor included the wavelength converting layer that is disposed between the peripheral region and both the outside surface of the semiconductor light-emitting chip and the concave surface of the wavelength converting layer. Thus, the disclosed subject matter can provide semiconductor light-emitting devices that can emit a wavelength-converted light having a high light-emitting efficiency and a substantially uniform color tone from various small light-emitting surfaces.

In the above-described exemplary semiconductor light-emitting device, one semiconductor light-emitting chip can be used in place of the plurality of light-emitting chips. In this case, the light-emitting device can perform the above-described features such as the various small light-emitting surfaces emitting a substantially uniform color tone, which can be utilized for the one semiconductor light-emitting chip.

According to another aspect of the disclosed subject matter, a vehicle headlight including a semiconductor light-emitting device in accordance with the disclosed subject matter can include a heat sink mounting the light-emitting device, and a reflector having an opening portion located adjacent the heat sink so that light emitted from the semiconductor light-emitting device is emitted in a light-emitting direction of the vehicle headlight from the opening portion of the reflector. Thus, the disclosed subject matter can provide vehicle headlights with a simple optical structure by using the above-described semiconductor light-emitting device.

Another aspect of the disclosed subject matter includes methods for manufacturing semiconductor light-emitting devices. An exemplary method can include: providing a base board; connecting each of the chip electrodes of the light-emitting chips to a respective portion of the conductor pattern of the base board via solder bumps; disposing an uncured wavelength converting material between the bottom surface of the optical plate and the outside surface of the light-emitting chips so as to extend from the outside surface of the light-emitting chips toward the edge of the optical plate; and disposing an uncured reflective material at least between the frame and the side surfaces of the wavelength converting layer and the optical plate and between both the bottom surface of each of the semiconductor light-emitting chips and the at least one concave surface of the wavelength converting layer and the mounting surface of the base board.

The above-described exemplary method for manufacturing semiconductor light-emitting devices can be used to make any semi-conductor light-emitting device according to the disclosed subject matter.

According to the exemplary manufacturing method described above for the semiconductor light-emitting devices, the side slant or inclined surface and the convex surface of the reflective material layer used as the reflector can be formed by disposing an uncured reflective material between the frame and the side surfaces of the wavelength converting layer and the optical plate and between both the bottom surface of each of the light-emitting chips and the at least one concave surface of the wavelength converting layer and the mounting surface of the base board. The wavelength converting layer and the reflective material layer can be solidified by a similar method as compared to conventional processes. Thus, the method can provide semiconductor light-emitting devices having various small light-emitting surfaces, a high light-emitting efficiency and a substantially uniform color tone using manufacturing machines that are similar to those used to manufacture conventional semiconductor light-emitting devices.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
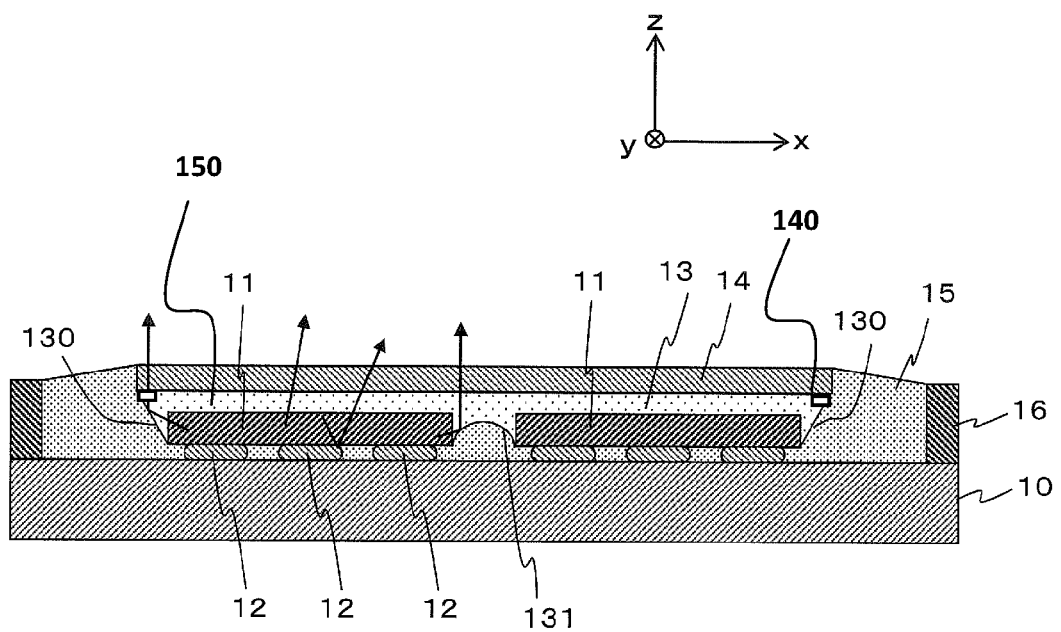
FIG. 1 is an enlarged side cross-sectional view showing an exemplary embodiment of a semiconductor light-emitting device made in accordance with principles of the disclosed subject matter.

Exemplary embodiments and manufacturing methods of the disclosed subject matter will now be described in detail with reference to FIGS. 1 to 5b. FIG. 1 is an enlarged side cross-sectional view showing an exemplary embodiment of a semiconductor light-emitting device made in accordance with principles of the disclosed subject matter.

The semiconductor light-emitting device can include a base board 10 having a mounting surface and a conductor pattern (not shown in FIG. 1) formed on the mounting surface, and a plurality of semiconductor light-emitting chips 11 having an outside surface and at least one pair of adjacent surfaces located between the adjacent light-emitting chips, each of the light-emitting chips 11 having a top surface and a bottom surface and including chip electrodes adjacent the bottom surface.

Each of the chip electrodes can be mounted on the mounting surface of the base board 10 via solder bumps 12 and can be electrically connected to a respective portion of the conductor pattern of the base board 10 via the solder bumps 12. The semiconductor light-emitting chips 11 can be aligned in the x-direction so that the at least one pair of adjacent surfaces of the light-emitting chips 11 are substantially parallel with respect to each other.

Additionally, the semiconductor light-emitting device can include an optical plate 14 having a top surface, a bottom surface, a side surface and an edge located between the side surface and the bottom surface of the optical plate 14. The optical plate 14 can be located over the top surface of each of the semiconductor light-emitting chips 11, and each of the top surface and the bottom surface of optical plate 14 can be slightly larger than the combined top surfaces of the light-emitting chips 11.

The semiconductor light-emitting device can also include a wavelength converting layer 13 having a side surface and at least one concave surface, which is located between the at least one pair of adjacent surfaces of the light-emitting chips 11. The wavelength converting layer 13 can include at least one phosphor in a transparent resin such as a silicone resin and can be disposed between the outside surface of the semiconductor light-emitting chips 11 and the edge of the optical plate 14.

Accordingly, the side surface of the wavelength converting layer 13 can extend from the outside surface of the semiconductor light-emitting chips 11 toward the edge of the optical plate 14. The at least one concave surface of the wavelength converting layer 13 can be located between the at least one pair of adjacent surfaces of the light-emitting chips 11 and can be formed in a concave shape toward the optical plate 14.

Moreover, the semiconductor light-emitting chip can include a frame 16 located along an outer circumference of the base board 10 so as to surround the light-emitting chips 11 and the wavelength converting layer 13. A reflective material layer 15 made of a material having a high reflectivity can be disposed between the frame 16 and both the side surface of the optical plate 14 and the side surface of the wavelength converting layer 13, and also can be disposed between both the bottom surface of each of the light-emitting chips 11 and the at least one concave surface of the wavelength converting layer 13 and the mounting surface of the base board 10 so as to fill a space between the solder bumps 12.

By disposing the reflective material layer 15 between the bottom surface of each of the light-emitting chips 11 and the mounting surface of the base board 10 so as to fill the space between the solder bumps 12, light emitted in a downward direction of the light-emitting chips 11 from the light-emitting chips 11 can be reflected on the reflective material layer 15 and can be emitted from the top surface of each of the light-emitting chips 11. Accordingly, light use efficiency of the semiconductor light-emitting device can improve.

The bottom surface of the optical plate 14 can have a slightly larger area than the area of the combined top surfaces of the light-emitting chips 11. The optical plate 14 can be located over the semiconductor light-emitting chips 11 so that the bottom surface of the optical plate 14 can cover the top surface of each of the light-emitting chips 11. In other words, an outermost periphery of the semiconductor light-emitting chips 11 will be completely blocked from view by (or, contained within an outermost perimeter of) the optical plate 14 when the device is viewed from a position on a main optical axis which extends normal to the top surface of the optical plate 14 and in the z-direction as shown in FIG. 1.

Therefore, an inclined side surface 130 (or side slant surface) formed on a boundary between the reflective material layer 15 and the wavelength converting layer 13 can become a reflective surface for each of the plurality of semiconductor light-emitting chips 11 along with at least one convex surface 131, which is formed on another boundary between the reflective material layer 15 and the wavelength converting layer 13. The inclined side surface 130 and the convex surface 131 can reflect light emitted in a crosswise direction from each of the light-emitting chips 11 toward the bottom surface of the optical plate 14 via the wavelength converting layer 13, as shown by arrows in FIG. 1.

That is to say, the reflective material layer 15 can perform as a reflector for each of the light-emitting chips 11 by using the inclined side surface 130, the at least one convex surface 131 and the boundary surface, which contacts with the bottom surface of each of the plurality of semiconductor light-emitting chips 11.

Thus, the semiconductor light-emitting device can improve light-emitting efficiency. In addition, because the reflective material layer 15 can be configured to contact the side surface of the optical plate 14, the top surface of the optical plate 14 can perform as a light-emitting surface of the semiconductor light-emitting device. Thus, the disclosed subject matter can realize a very small light-emitting surface that is slightly larger than the combined top surfaces of the light-emitting chips 11, by using the top surface of the optical plate 14.

The inclined side surface 130 can be formed in a linear shape connecting an end of the bottom surface of the optical plate 14 to an end toward the bottom surface of each of the light-emitting chips 11 on the outside surface of the light-emitting chips 11, and can also be formed in a concave shape extending in an outward direction away from a center of the semiconductor light-emitting device and in a convex shape extending in an inward direction towards a center of the device, respectively.

In these cases, the reflective material layer 15 can include the inclined side surface 130, which is formed in the linear shape connecting the end of the bottom surface of the optical plate 14 to the end of the bottom surface of each of the light-emitting chips 11, and the convex surface 131, which is formed between the one pair of adjacent surfaces that face each other between the adjacent light-emitting chips, as shown in FIG. 1, in order to increase light directed toward the bottom surface of the optical plate 14.

When the inclined side surface 130 is formed in the convex shape in the inward direction of the light-emitting device, a curvature of the convex shape can be formed at 5 or less as described in detail with reference to a result of a computer simulation in Patent Document No. 7 (and in U.S. patent application Ser. No. 13/162,151 filed on Jun. 16, 2011) which disclosures are incorporated by reference herein. A curvature of the at least one convex surface 131 of the reflective material layer 15 can also be formed 5 or less.

An end of the inclined side surface 130 toward the semiconductor light-emitting chips 11 can be located other than at the end of the bottom surface of each of the light-emitting chips 11 in common with the convex surface 131. The end of the inclined side surface 130 can be located on the outside surface of the light-emitting chips 11, which is between both ends of top and bottom surfaces adjacent the outside surface of the light-emitting chips 11 in common with the convex surface 131. When the end of the inclined side surface 130 is located on the side surface of the light-emitting chips 11, the inclined side surface 130 can become the reflex (e.g., a reflector type) surface, which can reflect light emitted in the crosswise direction of the light-emitting chips 11 toward the bottom surface of the optical plate 14 after wavelength-converting the light via the wavelength converting layer 13.

Each of the semiconductor light-emitting chips 11 can be mounted on the conductor pattern of the mounting surface of the base board 10 with a flip-chip structure. For example, electrodes that are coplanar with the bottom surface of each of the light-emitting chips 11 can be connected to conductor patterns of the mounting surface of the base board 10. When each of the light-emitting chips 11 is a flip-chip type chip, because a light-emitting layer of each of the light-emitting chips 11 may be located close to the bottom surface of each of the light-emitting chips 11, a reflecting feature of the inclined side surface 130 can be performed with high efficiency.

The base board 10 can include an aluminum nitride substrate having a high thermal conductivity and the like, and the conductor patterns can be made from gold (Au) and the like and formed on the base board 10 to mount the semiconductor light-emitting chips 11 and to receive a power supply for the semiconductor light-emitting chips 11. The optical plate 14 can be formed of a transparent resin such as a silicone resin, an epoxy resin and the like, and also can be formed of a phosphor plate including a phosphor such as a phosphor ceramic, a phosphor glass, etc. At least one of the top surface and the bottom surface of the optical plate 14 can be a roughened surface in order to scatter light emitted from the light-emitting chips 11 via the wavelength converting layer 13 and the like as described later.

Each of the light-emitting chips 11 can be formed in a substantially cubic shape, and can be blue LED chips having a peak wavelength of 460 nanometers. The wavelength converting layer 13 can include a phosphor to convert light emitted from each of the light-emitting chips 11 into a particular wavelength or range of wavelengths of light. Thus, the phosphor can be excited by the light emitted from each of the light-emitting chips 11, and can emit a wavelength-converted light. Accordingly, the semiconductor light-emitting device can emit a different wavelength from that of each of the light-emitting chips 11 by an additive color mixture of a part of the light emitted from each of the light-emitting chips 11 and the wavelength-converted light excited by another part of the light.

The wavelength converting layer 13 can include a resin layer that is made by mixing a yellow phosphor with a transparent resin such as a silicone resin and the like. The wavelength converting layer 13 can also include at least one of a diffusing material and a particulate spacer 150 having a predetermined particle size (e.g., 10 to 100 micro meters) along with the yellow phosphor. The diffusing material 150 can diffuse light emitted from each of the light-emitting chips 11.

The particulate spacer 150 can define a thickness of the wavelength converting layer 13 between the top surface of each of the light-emitting chips 11 and the bottom surface of the optical plate 14 in accordance with the predetermined particle size of the particulate spacer 150, which may be larger than a maximum particle size of the yellow phosphor, as disclosed in Patent Document No. 8. Thereby, because the thickness of the wavelength converting layer 13 can become uniform, a color variation of the wavelength-converted light emitted from the top surface of the optical plate 14 can be reduced.

Each of the light-emitting chips 11 can be a blue LED chip having a peak wavelength of 460 nanometers. The yellow phosphor can emit a yellow light upon being excited by blue light emitted from the blue LED chip. The semiconductor light-emitting device can emit substantially white light by an additive color mixture of the excited yellow light emitted from the yellow phosphor and a part of the blue light emitted from the blue LED chip.

The yellow phosphor can include $Y_3Al_5O_{12}:Ce^{3+}$ (YAG) and the like. In place of the yellow phosphor, a red phosphor (e.g., $CaAlSiN_3:Eu^{2+}$) wavelength-converting the blue light emitted from the blue LED chip into red-purple light, and a green phosphor (e.g., $Y_3(Ga, Al)_5O_{12}:Ce^{3+}$) wavelength-converting the blue light into blue-green light can also be used. In this case, the semiconductor light-emitting device can emit light having substantially white light by an additive color mixture of the red-purple light emitted from the red phosphor that is excited by the blue light, the blue-green light emitted from the green phosphor that is excited by the blue light and a part of the blue light.

Each of the light-emitting chips 11 can also include an LED of InGaN series that emits near-ultraviolet light having a wavelength of approximately 380 nanometers, a laser diode that emits ultraviolet light, and the like. In this case, in order to emit substantially white light, the at least one phosphor can include: a red phosphor (e.g., $CaAlSiN_3:Eu^{2+}$) wavelength-converting the ultraviolet light into red light; a green phosphor (e.g., $(Si, Al)_6 (O, N):Eu^{2+}$) wavelength-converting the ultraviolet light into green light; and a blue phosphor (e.g., $(Sr, Ca, Ba, Mg)_{10}(PO_4)_6Cl_2:Eu^{2+}$) wavelength-converting the ultraviolet light into blue light.

The frame 16 can be formed from the same material as the base board 10, such as with aluminum nitride having a high thermal conductivity, ceramics, and the like. The frame 16 can be attached on the outer perimeter of the mounting surface of the base board 10 via an adhesive material so as to surround the semiconductor light-emitting chips 11 and the wavelength converting layer 13, which is located between the semiconductor light-emitting chips 11 and the optical plate 14.

The reflective material layer 15 can be made by dispersing a reflective filler such as titanium oxide, zinc oxide and the like into a transparent resin such as a silicone resin and can be disposed between the frame 16 and the side surfaces of the wavelength converting layer 13 and the optical plate 14 so as to fill a space between both the bottom surface of each of the light-emitting chips 11 and the at least one convex surface of the wavelength converting layer 13 and the mounting surface of the base board 10.

A top surface of the reflective material layer 15 can be formed between an end of the top surface of the optical plate 14 and an inner end of a top surface of the frame 16. Consequently, the semiconductor light-emitting device can be constructed so that the top surface of the optical plate 14 can become the light-emitting surface, which is slightly larger than the top surface of each of the light-emitting chips 11.

The optical plate 14 can include an outer meniscus control structure 140 along the edge of the optical plate 14 so as to project from the bottom surface of the optical plate 14 toward the wavelength converting layer 13, as disclosed in Patent Document No. 10. In this case, even when an outline of the optical plate 14 is different from that of the plurality of light-emitting chips 11 in some degree, an uncured wavelength converting material can be expanded along the outline of the optical plate 14 due to the outer meniscus control structure 140. Thus, the disclosed subject matter can provide semiconductor light-emitting devices having various small light-emitting surfaces such as a circle, an ellipse, a hexagon, etc.

Figure 2A:
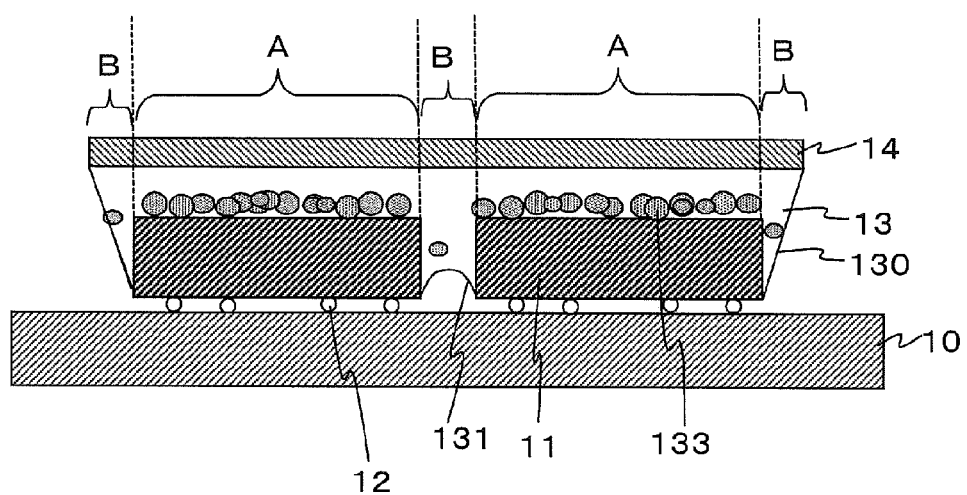
FIG. 2a is an enlarged cross-sectional schematic view showing an exemplary distribution of a phosphor in the embodiment of the semiconductor light-emitting device shown in FIG. 1.
Figure 2B:
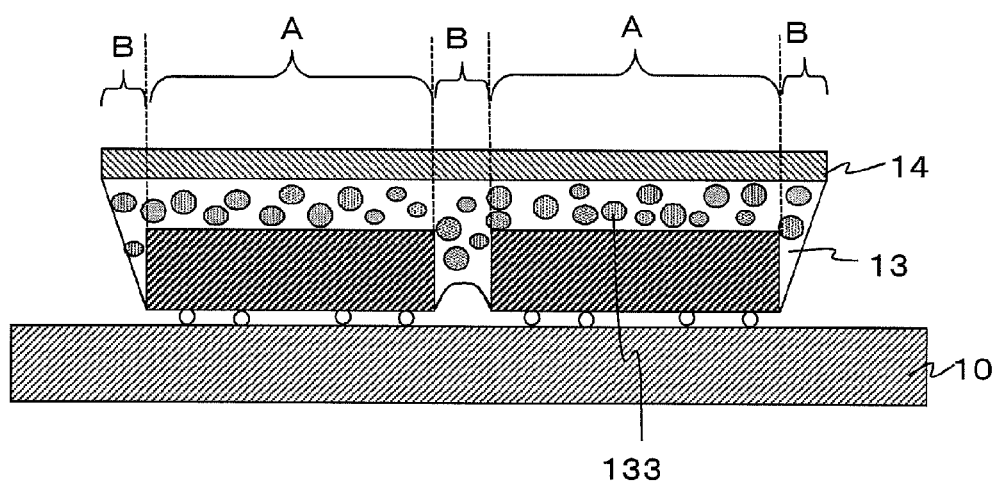
FIG. 2b is an enlarged cross-sectional schematic view showing an exemplary uniform distribution of the phosphor in a comparative exemplary embodiment of a semiconductor light-emitting device.

Here, additional features of the disclosed subject matter will now be described with reference to FIGS. 2a and 2b. FIG. 2a is an enlarged cross-sectional schematic view showing an exemplary distribution of the phosphor in the embodiment of the semiconductor light-emitting device shown in FIG. 1, and FIG. 2b is an enlarged cross-sectional schematic view showing an exemplary uniform distribution of the phosphor in a comparative exemplary embodiment of a semiconductor light-emitting device.

The optical plate 14 can include a middle region A that overlaps the top surface of each of the light-emitting chips 11, and a peripheral region B that is located at a surrounding portion excepting the middle region A from the optical plate 14. The peripheral region B of the optical plate 14 can surround the middle region A without a space, and also can include the edge of the optical plate 14.

A density of the phosphor 133 included in the wavelength converting layer 13 that is disposed between the middle region A of the optical plate and the top surface of each of the light-emitting chips 11 can be higher than that of the phosphor 133 included in the wavelength converting layer 13 that is disposed under the peripheral region B of the optical plate 14, which are located between the peripheral region B and both the side surface of each of the light-emitting chips 11 and the at least one concave surface of the wavelength converting layer 13.

In addition, when the wavelength converting layer 13 is divided into two equal layers of an upper layer and a lower layer by an imaginary central plane, which is located at a virtual central surface between the optical plate 14 and the top surface of each of the light-emitting chips 11, a density of the phosphor 133 that is included in the wavelength converting layer 13 of the lower layer can be higher than that of the phosphor 133 that is included in the wavelength converting layer 13 of the upper layer.

According to the semiconductor light-emitting device having the above-described structure, light emitted in an upward direction from the semiconductor light-emitting chips 11 can enter into the wavelength converting layer 13, and a wavelength-converted light can be emitted from the top surface of the optical plate 14. Light emitted in a downward direction from the semiconductor light-emitting chips 11 can be reflected at the bottom surface of each of the light-emitting chips 11 by the reflective material layer 15, and a wavelength-converted light can be emitted from the top surface of the optical plate 14 as well as the light emitted in the upward direction from the semiconductor light-emitting chips 11.

Light emitted in a crosswise direction from the semiconductor light-emitting chips 11 such as light emitted from the outside surfaces of the light-emitting chips 11 can be reflected toward the optical plate 14 via the wavelength converting layer 13, by the inclined side surface 130 and the at least one convex surface 131, which are formed at the boundaries between the reflective material layer 15 and the wavelength converting layer 13.

Thereby, the light emitted in the crosswise direction of the light-emitting chips 11 can be prevented from being absorbed by the light-emitting chips 11 because the above-described light may not return into the light-emitting chips 11 when so reflected. In addition, because a distance between the outside surface of the light-emitting chips 11 and the reflective material layer 15 is very short, the light emitted in the crosswise direction of the light-emitting chips 11 can be prevented from being absorbed by the wavelength converting layer 13. Therefore, the semiconductor light-emitting device can improve a light-emitting efficiency of light emitted from the light-emitting chips 11.

In the above-described structures of the semiconductor light-emitting device, a path length of light emitted toward the peripheral region B of the optical plate 14 may be longer than that of light emitted from the top surface of each of the light-emitting chips 11 toward the middle region A of the optical plate 14. Accordingly, when the density of the phosphor 133 included in the wavelength converting layer 14 is nearly equal between the middle region A and the peripheral region B of the optical plate 14 as shown in FIG. 2b, because a wavelength-converted light emitted from the peripheral region B may include a larger amount of exciting light excited by the phosphor than that emitted from the middle region A of the optical plate 14.

Hence, a difference of the amount of exciting light may cause a color variation between the wavelength-converted lights emitted from the middle region A and the peripheral region B of the optical plate 14. However, the semiconductor light-emitting device of the disclosed subject matter can reduce the color variation between the wavelength-converted light emitted from the middle region A and the peripheral region B of the optical plate 14, because the density of the phosphor 133 included in the wavelength converting layer 13 that is disposed under the peripheral region B of the optical plate 14 can be lower than that of the phosphor 133 in the wavelength converting layer 13 which is disposed between the middle region A of the optical plate 14 and the top surface of each of the light-emitting chips 11.

A ratio of the density of the phosphor 133 of the middle region A and the density of the phosphor 13 of the peripheral region B can be determined in accordance with a thickness between the top surface of each of the light-emitting chips 11 and the bottom surface of the optical plate 14, each area of the middle region A and the peripheral region B of the optical plate 14, a light-emitting characteristic of each of the light-emitting chips 11, etc. The semiconductor light-emitting device can emit a wavelength-converted light having a substantially uniform color tone such that may not be recognized by the human eye, even when the wavelength-converted light is enlarged by a reflector and the like used for a headlight as described later.

In addition, the lower layer of the wavelength converting layer 13 can be formed in a thin shape, in which a density of the phosphor 133 included in the wavelength converting layer 13 is higher than that of the phosphor 133 in the upper layer, and therefore the lower layer can be formed in a basically uniform phosphor layer. Accordingly, the semiconductor light-emitting device can also reduce a color variation of light emitted from the top surface of each of light-emitting chips 11. Moreover, many of the phosphor 133 may contact with the top surface of each of the light-emitting chips 11, and therefore can efficiently transmit many of a heat generated from the phosphor 133 by exciting a part of light emitted from the light-emitting chips 11 toward the light-emitting chips 11.

Therefore, the structures of the semiconductor light-emitting device can prevent the wavelength converting layer 13 from a thermal quenching of the phosphor 133 therein. Furthermore, because the density of the phosphor 133 in the upper layer of the wavelength converting layer 13 can be low, the bottom surface of the optical plate 14 may hardly contact with the phosphor 133 but can contact with the transparent resin having an adhesive property included in the wavelength converting layer 13. Thus, an adhesive strength between the optical plate 14 and the wavelength converting layer 13 can keep at a high intensity.

As described above, the light emitted from the semiconductor light-emitting chips 11 can directly enter into the wavelength converting layer 13. Therefore, the semiconductor light-emitting device can emit a different wavelength light from that of the semiconductor light-emitting chips 11 by use of an additive color mixture of part of the light emitted from the semiconductor light-emitting chips 11 and the wavelength-converted light excited by another part of the light via the wavelength converting layer 13. Light emitted in a crosswise direction from the optical plate 14 can be reflected into the optical plate 14 at the side surface of the optical plate 14 by the reflective material layer 15, and can be emitted from the top surface of the optical plate 14.

Therefore, the disclosed subject matter can provide a small semiconductor light-emitting device having a small light-emitting surface, which is the top surface of the optical plate 14. In this case, because the reflective material layer 15 can be formed in a reflector shape that extends from the outside surface of the light-emitting chips 11 in a light-emitting direction of the light-emitting device, the light emitted in the crosswise direction of the light-emitting chips 11 can be prevented from returning to the light-emitting chips 11 and can be reflected toward the optical plate 14 by the inclined side surface 130 and the convex surface 131. Thus, the disclosed subject matter can provide a small semiconductor light-emitting device having a high light-emitting efficiency.

In addition, the density of the phosphor 133 included in the wavelength converting layer 13 that is disposed under the peripheral region B of the optical plate 14 can be lower than that of the phosphor 133 of the wavelength converting layer 13, which is disposed between the middle region A of the optical plate 14 and the top surface of each of the light-emitting chips 11, and also the lower layer of the wavelength converting layer 13 can be formed in a basically uniform phosphor layer. Accordingly, a color variation between lights emitted from the plurality of light-emitting chips 13 and color variability on a light-emitting surface of the device can be extremely reduced, and therefore the device can emit light having a substantially uniform color tone.

Moreover, many of the phosphor 133 may contact with the top surface of each of the light-emitting chips 11, and therefore can efficiently transmit many of a heat generated from the phosphor 133 toward the light-emitting chips 11. Therefore, the semiconductor light-emitting device can prevent the wavelength converting layer 13 from a thermal quenching of the phosphor 133 included in the wavelength converting layer 13. Additionally, because the density of the phosphor 133 in the upper layer of the wavelength converting layer 13 can be low, the bottom surface of the optical plate 14 may hardly contact with the phosphor 133 but can contact with the transparent resin having an adhesive property included in the wavelength converting layer 13. Thus, an adhesive strength between the optical plate 14 and the wavelength converting layer 13 can keep at a high intensity.

Furthermore, because the outer meniscus control structure of the optical plate 14 can be located along the edge of the optical plate 14 so as to project between the reflective material layer 15 and the wavelength converting layer 13, the adhesive strength between the optical plate 14 and both the wavelength converting layer 13 and the reflective material layer 15 can improve due to an increase of contacting areas thereto. Additionally, even when the outline of the optical plate 14 is different from that of the plurality of light-emitting chips 11 in some degree, an uncured wavelength converting material can be expanded along the outline of the optical plate 14. Thus, the disclosed subject matter can provide semiconductor light-emitting devices having various small light-emitting surfaces such as a circle, an ellipse, a hexagon, etc.

A manufacturing method for the above-described semiconductor light-emitting device will now be described in detail with reference to FIGS. 3a to 3f. FIGS. 3a to 3f are cross-sectional views showing an exemplary manufacturing process for the semiconductor light-emitting device made in accordance with principles of the disclosed subject matter.

Figure 3A:
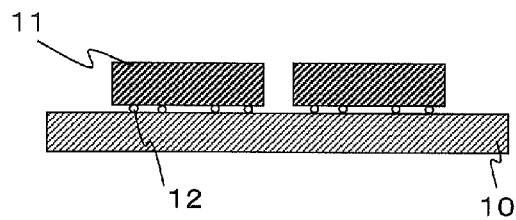
FIGS. 3a to 3f are cross-sectional views showing an exemplary manufacturing process for a semiconductor light-emitting device made in accordance with principles of the disclosed subject matter.

Process (a) is preparing the base board 10 having the conductor patterns formed on the mounting surface and the plurality of semiconductor light-emitting chips 11, and mounting the semiconductor light-emitting chips 11 on the conductor pattern of the base board 10 via the solder bumps 12 as shown in FIG. 3a.

Figure 3B:
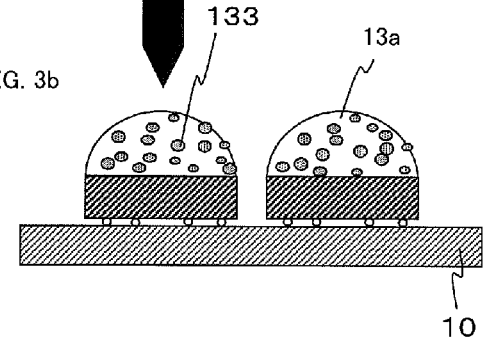

Process (b) is applying an uncured wavelength converting material 13a, in which the phosphor 133 is dispersed in a transparent resin such as a silicon resin, on the top surface of each of the light-emitting chips 11 by a dispenser and the like, as shown in FIG. 3b.

Figure 3C:
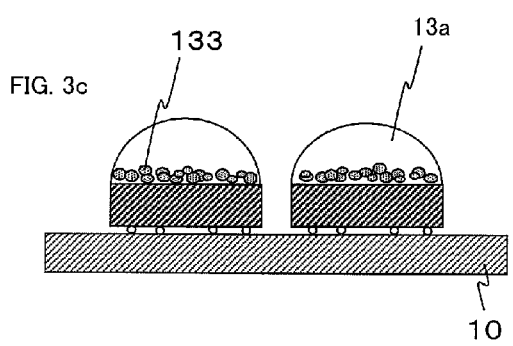

Process (c) is precipitating the phosphor 133 toward the top surface of each of the light-emitting chips 11, as shown in FIG. 3c. In this case, in order to accelerate a precipitating speed of the phosphor 133, the uncured wavelength converting material 13a may be heated but not being solidified so as to decrease a viscosity thereof (e.g., 50 to 80 degrees Celsius).

Figure 3D:
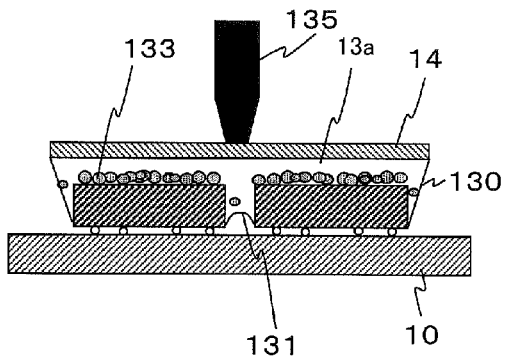

Process (d) is mounting the optical plate 14 that is formed in a slightly larger size than the combined top surfaces of the light-emitting chips 11 on the uncured wavelength converting material 13a using a collecting chuck and the like, wherein the inclined side surface 130 is formed from the outside surface of the light-emitting chips toward the bottom surface of the optical plate 14 by a surface tension while the convex surface 131 is formed from a meniscus shape between the adjacent light-emitting chips, as the reflector for each of the light-emitting chips, as shown in FIG. 3d.

In the uncured wavelength converting material 13a formed in accordance with the above-described process, a part of the uncured wavelength converting material 13a located upwards, in which a density of the part located upward becomes low after precipitating the phosphor 133 toward the top surface of each of the light-emitting chips 11, can expand toward the peripheral region B. Accordingly, the density of the uncured converting material 13a located under the peripheral region B can be lower than that of the uncured converting material 13a located between the middle region A of the optical plate 14 and the top surface of each of light-emitting chips 11.

In addition, the density of the uncured converting material 13a located under the peripheral region B can be adjusted by controlling the density of the part located upward, because the density of the part of the uncured wavelength converting material 13a located upward can be adjusted by controlling the above-described precipitating speed of the phosphor 133 and a time for precipitating the phosphor 133.

Then, Process (d) is solidifying the uncured wavelength converting material 13a under a prescribed curing condition. In this case, the uncured wavelength converting material 13a may be semi-solidified under a semi-curing condition if the shape of the wavelength converting layer 13 including the inclined side surface 130 does not vary in following processes.

Figure 3E:
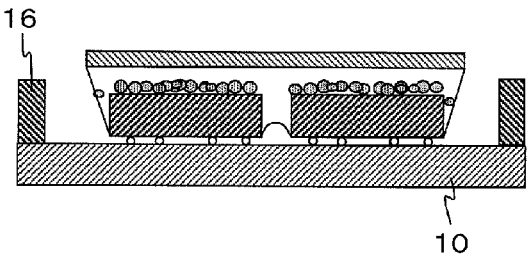
Figure 3F:
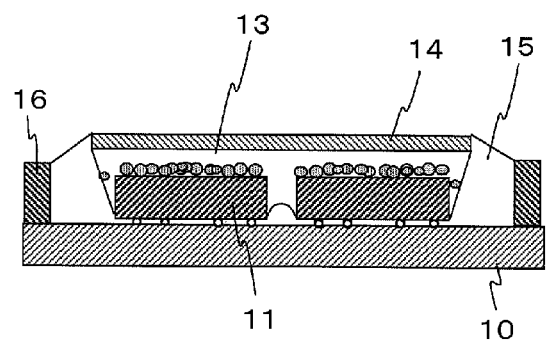

Process (e) is attaching the frame 16 on the outer circumference of the mounting surface of the base board 10 via the adhesive material so as to surround the light-emitting chips 11 and the wavelength converting layer 13, as shown in FIG. 3e.

Process (f) is disposing an uncured reflective material between the frame 16 and both the side surface of the wavelength converting layer 13 and the side surface of the optical plate 14 and in the space between both the bottom surface of each of the light-emitting chips 11 and the convex surface 131 of the wavelength converting layer 13 and the mounting surface of the base board 10 so that the uncured reflective material can contact both the outside surface of the wavelength converting layer 13 and the optical plate 14 without a space, by a dispenser and the like, thus forming the reflective material layer 15 including the above-described inclined side surface 130 and the convex surface 131 by solidifying the uncured reflective material under a prescribed curing condition, and finishing the semiconductor light-emitting device. The above process steps can be done consecutively and sequentially, or can be interchanged in timing and non-sequential.

As a variation in Process (b) of the above-described manufacturing method, an uncured wavelength converting material having a high density of the phosphor 133 and another uncured wavelength converting material having a low density of the phosphor 133 can be used in place of the uncured wavelength converting material 13a. Specifically, by disposing the other uncured wavelength converting material having a low density after disposing the uncured wavelength converting material having a high density on the top surface of each of the light-emitting chips 11, Process (c) for precipitating the phosphor 133 can be abbreviated.

In addition, as a variation in Process (c), in which the density of the uncured converting material 13a located under the peripheral region B is lower than that of the uncured converting material 13a located between the middle region A of the optical plate 14 and the top surface of each of light-emitting chips 11, the optical plate 14 having the bottom surface that is formed in a rough surface can be employed.

Figure 4:
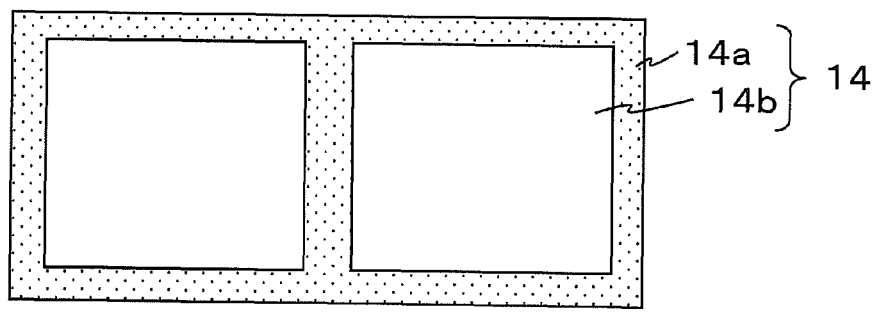
FIG. 4 is an enlarged rear view showing an exemplary shape of a bottom surface of an optical plate in another exemplary embodiment of the semiconductor light-emitting device of FIG. 1.

FIG. 4 is an enlarged rear view showing an exemplary shape of the bottom surface of the optical plate 14. A bottom surface 14a of the peripheral region B of the optical plate 14 can be formed in a rough surface, and a bottom surface 14b of the middle region A of the optical plate 14 can be formed in at least one of a rough surface and a plane surface. In this case, a roughness on the bottom surface 14a of the peripheral region B can be larger than that on the bottom surface 14b of the middle region A of the optical plate 14.

In this case, an uncured resin may easily expand on the bottom surface 14a having a rougher surface in the peripheral region B, while the bottom surface 14a having a rougher surface inhibits spreading of the phosphor 133. Therefore, the ratio of the densities of the phosphor 133 included in the wavelength converting layer 13 that is disposed underneath the middle region A and the peripheral region B of the optical plate 14 may be easily adjusted.

According to the above-described manufacturing methods of the disclosed subject matter, by creating the inclined side surface 130 and the convex surface 131 of the wavelength converting layer 13 using a surface tension of the uncured wavelength converting material 13a, and by disposing the uncured reflective material between the frame 16 and both the outside surface of the wavelength converting layer 13 and the side surface of the optical plate 14, the inclined side surface 130 and the convex surface 131 of the reflective material layer 15 can be formed in a prescribed shape and the reflective material layer 15 can be attached to both side surfaces of the optical plate 14 and the frame 16.

Thereby, the reflector shape having a predetermined shape can be formed from the outside surface of the light-emitting chips 11 toward the edge of the optical plate 14 while including the convex surface 131 between the adjacent light-emitting chips without a machining process. In addition, the manufacturing method can also dispose the reflective material in the space between the bottom surface of each of the light-emitting chips 11 and the mounting surface of the base board 10 when disposing the reflective material between the frame 16 and the side surfaces of the wavelength converting layer 13 and the optical plate 14.

Accordingly, the manufacturing method can prevent the semiconductor light-emitting chips 11 from absorbing light that is returned on the outside surface of the light-emitting chips 11 and can also prevent a decay of light emitted in the downward direction of the light-emitting chips 11. Thus, the manufacturing method can provide semiconductor light-emitting devices having a high light-emitting efficiency and a substantially uniform color tone. Moreover, because the light-emitting surface of the device is small, light emitted from the semiconductor light-emitting device can be efficiently controlled by a small and simple optical structure.

When the above-described outer meniscus control structure 140 is formed underneath the bottom surface of the optical plate 14, the top surface of the optical plate 14 can easily be formed in various shapes as the light-emitting surface of the device by locating the outer meniscus control structure 140 along the edge of the optical plate 14, as long as the shapes are slightly larger than the outline of the combined top surfaces of the light-emitting chips 11. Even when the top surface of the optical plate 14 is not similar to the outline of the top surfaces of the light-emitting chips 11, the uncured wavelength converting material 13a can be disposed between the side surface of the light-emitting chips 11 and the edge of the optical plate 14.

Thus, the disclosed subject matter can provide semiconductor light-emitting devices which can improve the color variability between the adjacent light-emitting chips 11 as well as emit light having uniform color tone and a high light-emitting efficiency from the light-emitting surface having the various shapes by using the outer meniscus control structure 140, which is located underneath the bottom surface of the optical plate 14 along the edge.

Figure 5A:
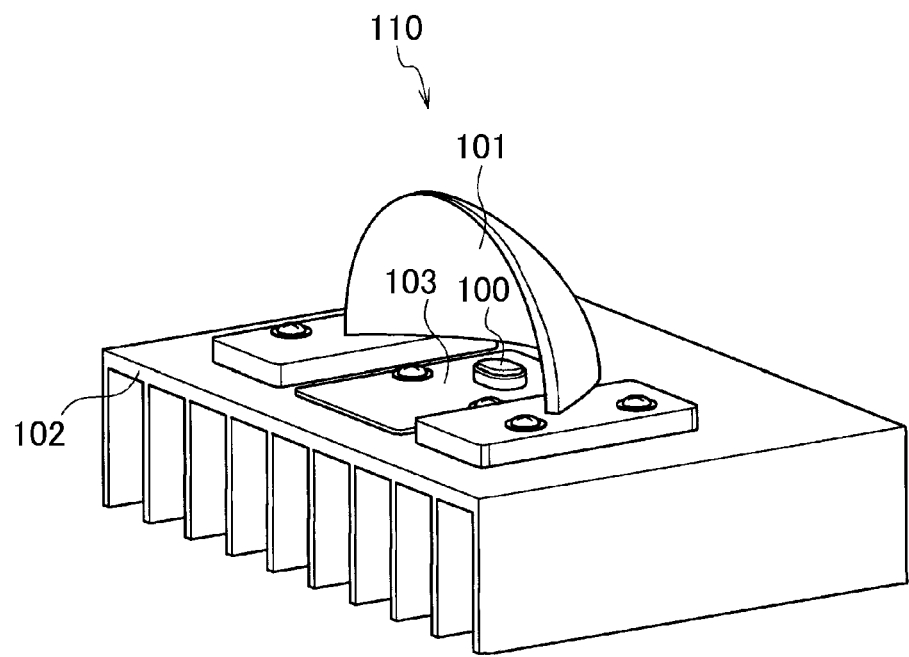
FIG. 5a is a schematic perspective view showing an exemplary vehicle headlight using a semiconductor light-emitting device made in accordance with principles of the disclosed subject matter.
Figure 5B:
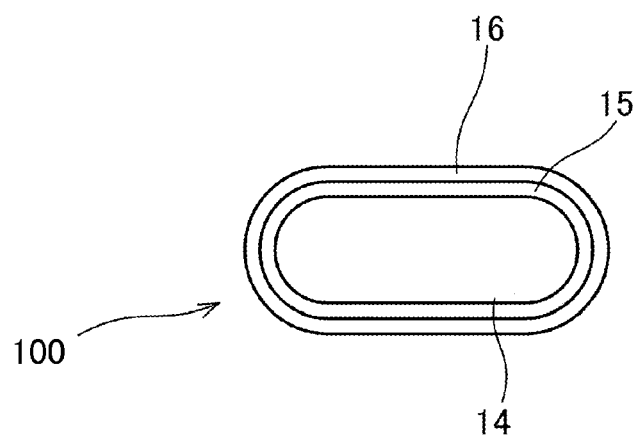
FIG. 5b is an enlarged top view showing the semiconductor light-emitting device.
Figure 6A:
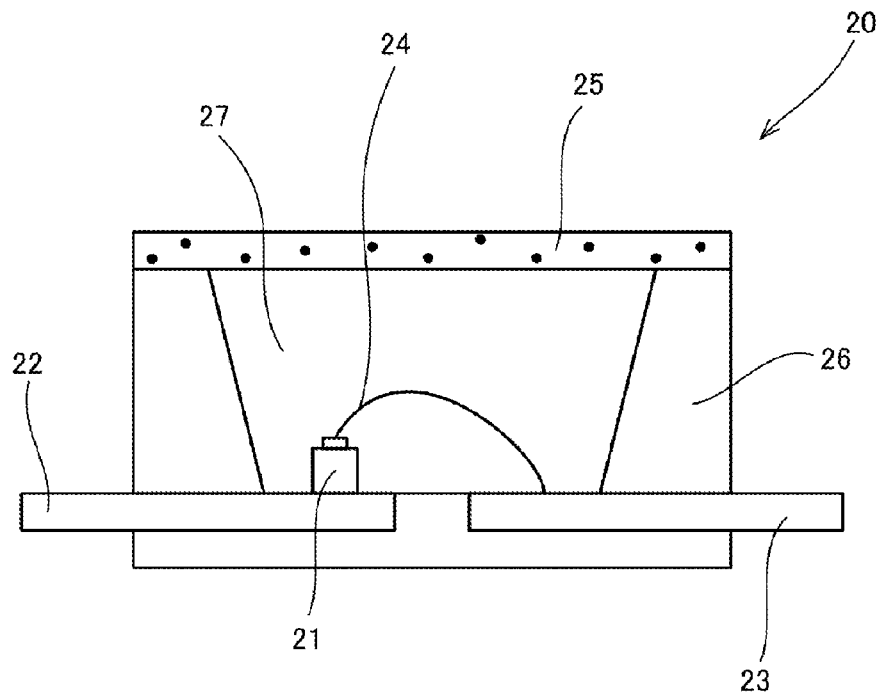
FIGS. 6a and 6b are side cross-sectional views showing a conventional lead frame type light-emitting device and a conventional radial type light-emitting device, respectively.
Figure 6B:
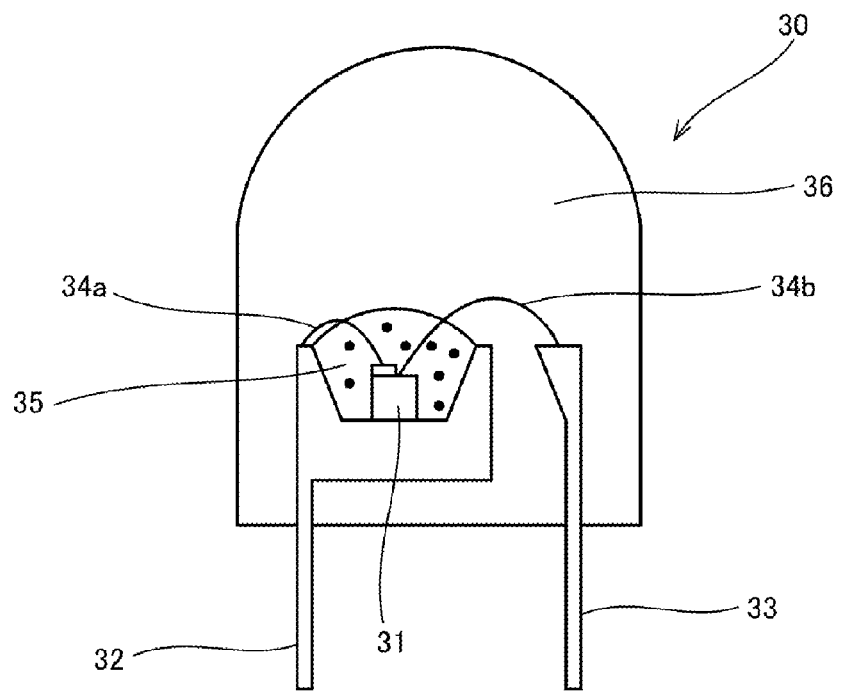
Figure 7:
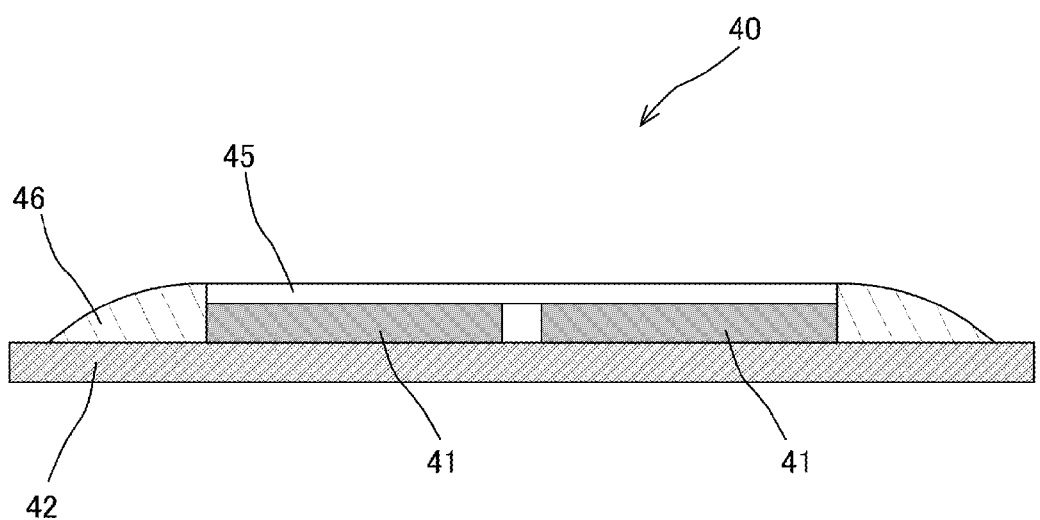
FIG. 7 is a cross-sectional view showing another conventional semiconductor light-emitting device.

FIG. 5a is a schematic perspective view showing an exemplary vehicle headlight using a semiconductor light-emitting device made in accordance with principles of the disclosed subject matter, and FIG. 5b is an enlarged top view showing the semiconductor light-emitting device. The light-emitting device 100 can emit light having a high light-emitting efficiency and a uniform color tone even when the plurality of light-emitting chips 11 is used, from a small light-emitting surface that is slightly larger than the top surface of each of the light-emitting chips 11 and that is formed in a point light source shape. In addition, a light intensity near the main optical axis of the device can be increased by concentrating the light-emitting chips near the main optical axis so as to match a light distribution pattern for the vehicle headlight.

The vehicle headlight 110 can include: the light-emitting device 100; a heat sink 102 mounting the light-emitting device 100 via a mounting base board 103; and a reflector 101 having an opening portion located adjacent the heat sink 102 so that light emitted from the semiconductor light-emitting device 100 is emitted in a light-emitting direction of the vehicle headlight 110 from the opening portion of the reflector 101. Therefore, the disclosed subject matter can provide vehicle headlights having a favorable light distribution pattern with a simple optical structure.

The above-described embodiments are described with respect to a case where the device includes the plurality of semiconductor light-emitting chips 11. When one semiconductor light-emitting chip is used for the device in place of the plurality of light-emitting chips 11, the above-described features in the embodiments and the manufacturing methods, such as the various small light-emitting surfaces, the inclined side surface 130 used as the reflector and the like can also be utilized for the device including the one semiconductor light-emitting chip.

As described above, the disclosed subject matter can form a light-emitting surface in small various shapes such that are slightly larger than the top surface of at least one semiconductor light-emitting chip 11, and can improve a light-emitting efficiency by using the inclined side surface 130 of the reflective material layer 15 as a reflector for the at least one light-emitting chip 11. In addition, even when the plurality of light-emitting chips 11 is mounted on the base board 10, a variation of a color tone and a light intensity between the light-emitting chips 11 can be reduced. Thus, the disclosed subject matter can provide a semiconductor light-emitting device having various small light-emitting surfaces, a high light-emitting efficiency and a substantially uniform color tone, which can be used for lighting units such as a vehicle headlight that controls light emitted from the light-emitting device using a reflector and/or a projector lens.

Moreover, the inclined side surface 130 can be formed by disposing the uncured wavelength converting material 13a on the top surface of the at least one light-emitting chip 11 and by disposing the uncured reflective material between the frame 16 and the wavelength converting layer 13 without a mechanical process. Thus, the method of the disclosed subject matter can provide a semiconductor light-emitting device capable of being used as a lighting unit such as a headlight using manufacturing machines that are similar to those used to manufacture conventional semiconductor light-emitting devices.

Furthermore, the above-described embodiments are mainly described as a light source device for a vehicle headlight. However, the semiconductor light-emitting device can incorporate various colored lights by combining the above-described semiconductor chip 11 with the wavelength converting layer 13 including at least one phosphor, and therefore can also be used as a light source device for various applications such as general lighting, a street light, stage lighting, traffic lights and the like using a small and simple optical structure. In addition, it is conceived that each of the different aspects and features of the different embodiments disclosed herein could be used interchangeably in and with the other disclosed embodiments. For example, the multiple chip embodiment could inclined include surfaces 130 that are concave. In addition, one side of a device can include an inclined side surface 130 that is convex while another side of the device includes an inclined side surface 130 that is concave. In addition, it is contemplated that any different color chip or different wavelength converting material can be used in any of the disclosed embodiments and in any combination. The light source device can also be made without the use of any meniscus control structure 140.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
    a base board having a mounting surface and a conductor pattern located on the mounting surface;
    a semiconductor light-emitting chip having a bottom surface, a top surface and an outside surface, and including chip electrodes adjacent the bottom surface, the chip electrodes being electrically connected to a respective portion of the conductor pattern of the base board via solder bumps;
    an optical plate having a side surface, a bottom surface, a middle region, a peripheral region and an edge located between the side surface and the bottom surface, the peripheral region surrounding the middle region and including the edge of the optical plate, the optical plate being located over the top surface of the semiconductor light-emitting chip so that the middle region of the optical plate overlaps the top surface of the semiconductor light-emitting chip;
    a wavelength converting layer having a side surface and a thickness, the wavelength converting layer including at least one phosphor and disposed between the edge of the optical plate and the outside surface of the semiconductor light-emitting chip so that the side surface of the wavelength converting layer extends from the outside surface of the semiconductor light-emitting chip toward the edge of the optical plate, wherein a density of the at least one phosphor included in the wavelength converting layer that is disposed between the middle region of the optical plate and the top surface of the semiconductor light-emitting chip is higher than that of the phosphor included in the wavelength converting layer that is disposed between the peripheral region of the optical plate and the outside surface of the semiconductor light-emitting chip;
    a frame located adjacent the mounting surface of the base board so as to surround the semiconductor light-emitting chip and the wavelength converting layer; and
    a reflective material layer having an inclined side surface disposed between the frame and both the side surface of the wavelength converting layer and the side surface of the optical plate and between the bottom surface of the semiconductor light-emitting chip and the mounting surface of the base board while also surrounding the solder bumps, wherein the inclined side surface contacts with the side surface of the wavelength converting layer and extends from the outside surface of the semiconductor light-emitting chip toward the edge of the optical plate.

2. The semiconductor light-emitting device according to claim 1, wherein the wavelength converting layer includes an upper layer and a lower layer that are divided by an imaginary central plane between the bottom surface of the optical plate and the top surface of the semiconductor light-emitting chip, and a density of the phosphor included in the wavelength converting layer of the lower layer located on the top surface of the semiconductor light-emitting chip is higher than a density of the phosphor included in the wavelength converting layer of the upper layer.

3. The semiconductor light-emitting device according to claim 1, wherein the inclined side surface of the reflective material layer is formed in at least one of a substantially linear shape and a convex shape having a curvature of 5 or less extending in a direction toward the semiconductor light-emitting chip between the side surface of the semiconductor light-emitting chip and the edge of the optical plate.

4. The semiconductor light-emitting device according to claim 1, further comprising:
    an outer meniscus control structure projecting from the bottom surface of the optical plate toward the semiconductor light-emitting chip and extending along the edge of the optical plate, wherein the side surfaces of the wavelength converting layer extend from the outside surface of the semiconductor light-emitting chip to the outer meniscus control structure.

5. The semiconductor light-emitting device according to claim 1, further comprising:
    a particulate spacer disposed in the wavelength converting layer, wherein the thickness of the wavelength converting layer is defined between the top surface of the semiconductor light-emitting chip and the bottom surface of the optical plate by supporting the bottom surface of the optical plate using the particulate spacer located on the top surface of the semiconductor light-emitting chip.

6. The semiconductor light-emitting device according to claim 1, further comprising a plurality of semiconductor light-emitting chips electrically connected to a respective portion of the conductor pattern of the base board.

7. A method for manufacturing the semiconductor light-emitting device according to claim 1, comprising:
    providing the base board;
    connecting each of the chip electrodes of the semiconductor light-emitting chip to a respective portion of the conductor pattern of the base board via the solder bumps;
    disposing an uncured wavelength converting material between the bottom surface of the optical plate and the outside surface of the semiconductor light-emitting chip so as to extend from the outside surface of the semiconductor light-emitting chip toward the edge of the optical plate; and
    disposing an uncured reflective material at least between the frame and both the side surface of the wavelength converting layer and the side surface of the optical plate and between the bottom surface of the semiconductor light-emitting chip and the mounting surface of the base board.

8. The semiconductor light-emitting device according to claim 1, wherein the bottom surface of the peripheral region of the optical plate is formed as a rough surface, and the bottom surface of the middle region of the optical plate is formed as at least one of a rough surface and a plane surface, wherein a roughness on the bottom surface of the peripheral region is larger than a roughness of the middle region.

9. A method for manufacturing the semiconductor light-emitting device according to claim 8, comprising:
providing the base board;
connecting each of the chip electrodes of the semiconductor light-emitting chip to a respective portion of the conductor pattern of the base board via the solder bumps;
disposing an uncured wavelength converting material between the bottom surface of the optical plate and the outside surface of the semiconductor light-emitting chip so as to extend from the outside surface of the semiconductor light-emitting chip toward the edge of the optical plate; and
disposing an uncured reflective material at least between the frame and both the side surface of the wavelength converting layer and the side surface of the optical plate and between the bottom surface of the semiconductor light-emitting chip and the mounting surface of the base board.

10. A semiconductor light-emitting device comprising:
a base board having a mounting surface and a conductor pattern formed on the mounting surface;
a plurality of semiconductor light-emitting chips having an outside surface and at least one pair of adjacent surfaces, and each of the semiconductor light-emitting chips having a bottom surface and a top surface, and including chip electrodes adjacent the bottom surface, the chip electrodes electrically connected to a respective portion of the conductor pattern of the base board via solder bumps, and the plurality of semiconductor light-emitting chips aligned so that each of the at least one pair of adjacent surfaces is substantially parallel with respect to each other;
an optical plate having a side surface, a bottom surface, a middle region, a peripheral region and an edge located between the side surface and the bottom surface, the peripheral region surrounding the middle region and including the edge of the optical plate, the optical plate being located over the top surface of each of the semiconductor light-emitting chips so that the middle region of the optical plate overlaps the top surface of each of the semiconductor light-emitting chips;
a wavelength converting layer having a thickness, at least one side surface and at least one concave surface, the wavelength converting layer including at least one phosphor and disposed between the outside surface of the semiconductor light-emitting chips and the edge of the optical plate so that the side surface of the wavelength converting layer extends from the outside surface of the semiconductor light-emitting chips toward the edge of the optical plate, and the concave surface of the wavelength converting layer being located between the at least one pair of adjacent surfaces and formed in a concave shape toward the peripheral region of the optical plate, wherein a density of the at least one phosphor included in the wavelength converting layer that is disposed between the middle region of the optical plate and the top surface of each of the semiconductor light-emitting chips is higher than a density of the phosphor included in the wavelength converting layer that is disposed between the peripheral region of the optical plate and both the outside surface of the semiconductor light-emitting chip and the at least one concave surface of the wavelength converting layer;
a frame located adjacent the mounting surface of the base board so as to surround the wavelength converting layer and the semiconductor light-emitting chips; and
a reflective material layer having an inclined side surface and at least one convex surface disposed between the frame and both the side surface of the wavelength converting layer and the side surface of the optical plate and between the bottom surface of each of the semiconductor light-emitting chips and the mounting surface of the base board while surrounding the solder bumps, wherein the inclined side surface contacts with the side surface of the wavelength converting layer and extends from the outside surface of the semiconductor light-emitting chips toward the edge of the optical plate, and the at least one convex surface also contacts with the at least one concave surface of the wavelength converting layer and extends toward the peripheral region of the optical plate between the at least one pair of adjacent surfaces of the plurality of semiconductor light-emitting chips.

11. The semiconductor light-emitting device according to claim 10, wherein the inclined side surface of the reflective material layer is formed in at least one of a substantially linear shape and a convex shape having a curvature of 5 or less extending in a direction toward the semiconductor light-emitting chips between the side surface of each of the semiconductor light-emitting chips and the edge of the optical plate.

12. The semiconductor light-emitting device according to claim 10, further comprising:
an outer meniscus control structure projecting from the bottom surface of the optical plate toward the semiconductor light-emitting chips and extending along the edge of the optical plate, wherein the side surface of the wavelength converting layer extends from the outside surface of the semiconductor light-emitting chips to the outer meniscus control structure.

13. The semiconductor light-emitting device according to claim 10, further comprising:
a particulate spacer disposed in the wavelength converting layer, wherein the thickness of the wavelength converting layer is defined between the top surface of each of the semiconductor light-emitting chips and the bottom surface of the optical plate by supporting the bottom surface of the optical plate using the particulate spacer located on the top surface of each of the semiconductor light-emitting chips.

14. A vehicle headlight including the semiconductor light-emitting device according to claim 10, and further comprising:
a heat sink connected with the semiconductor light-emitting device; and
a reflector having an opening portion located adjacent the heat sink so that light emitted from the semiconductor light-emitting device during operation of the semiconductor light-emitting device is emitted in a light-emitting direction of the vehicle headlight from the opening portion of the reflector.

15. The semiconductor light-emitting device according to claim 10, wherein the wavelength converting layer includes an upper layer and a lower layer that are divided by an imaginary central plane between the bottom surface of the optical plate and the top surface of each of the semiconductor light-emitting chips, and a density of the phosphor included in the wavelength converting layer of the lower layer located on the top surface of each of the light-emitting chips is higher than a density of the phosphor included in the wavelength converting layer of the upper layer.

16. A vehicle headlight including the semiconductor light-emitting device according to claim 15, and further comprising:
- a heat sink connected with the semiconductor light-emitting device; and
- a reflector having an opening portion located adjacent the heat sink so that light emitted from the semiconductor light-emitting device during operation of the semiconductor light-emitting device is emitted in a light-emitting direction of the vehicle headlight from the opening portion of the reflector.

17. The semiconductor light-emitting device according to claim 10, wherein the bottom surface of the peripheral region of the optical plate is formed as a rough surface, and the bottom surface of the middle region of the optical plate is formed as at least one of a rough surface and a plane surface, wherein a roughness on the bottom surface of the peripheral region is larger than a roughness of the middle region.

18. A method for manufacturing the semiconductor light-emitting device according to claim 17, comprising:
- providing the base board;
- connecting each of the chip electrodes of the semiconductor light-emitting chips to a respective portion of the conductor pattern of the base board via the solder bumps;
- disposing an uncured wavelength converting material between the bottom surface of the optical plate and the outside surface of the semiconductor light-emitting chips so as to extend from the outside surface of the semiconductor light-emitting chips toward the edge of the optical plate; and
- disposing an uncured reflective material at least between the frame and both the side surface of the wavelength converting layer and the side surface of the optical plate and between both the bottom surface of each of the semiconductor light-emitting chips and the at least one concave surface of the wavelength converting layer and the mounting surface of the base board.

19. A method for manufacturing the semiconductor light-emitting device according to claim 10, comprising:
- providing the base board;
- connecting each of the chip electrodes of the semiconductor light-emitting chips to a respective portion of the conductor pattern of the base board via the solder bumps;
- disposing an uncured wavelength converting material between the bottom surface of the optical plate and the outside surface of the semiconductor light-emitting chips so as to extend from the outside surface of the semiconductor light-emitting chips toward the edge of the optical plate; and
- disposing an uncured reflective material at least between the frame and both the side surface of the wavelength converting layer and the side surface of the optical plate and between both the bottom surface of each of the semiconductor light-emitting chips and the at least one concave surface of the wavelength converting layer and the mounting surface of the base board.

20. The method for manufacturing the semiconductor light-emitting device according to claim 19, further comprising:
- precipitating the at least one phosphor included in the uncured wavelength converting material toward the top surface of each of the semiconductor light-emitting chips, during disposing the uncured wavelength converting material between the bottom surface of the optical plate and the outside surface of the semiconductor light-emitting chips so as to extend from the outside surface of the semiconductor light-emitting chips toward the edge of the optical plate.

* * * * *